(12) United States Patent
Jung

(10) Patent No.: US 10,847,678 B2
(45) Date of Patent: Nov. 24, 2020

(54) LIGHT EMITTING DEVICE THAT INCLUDES A LIGHT-TRANSMISSIVE CONDUCTIVE LAYER

(71) Applicant: LG INNOTEK CO., LTD., Seoul (KR)

(72) Inventor: Se Yeon Jung, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 35 days.

(21) Appl. No.: 16/300,412

(22) PCT Filed: May 4, 2017

(86) PCT No.: PCT/KR2017/004719
§ 371 (c)(1),
(2) Date: Nov. 9, 2018

(87) PCT Pub. No.: WO2017/196022
PCT Pub. Date: Nov. 16, 2017

(65) Prior Publication Data
US 2019/0165210 A1 May 30, 2019

(30) Foreign Application Priority Data
May 9, 2016 (KR) .......... 10-2016-0056223

(51) Int. Cl.
| | |
|---|---|
| *H01L 33/22* | (2010.01) |
| *H01L 33/32* | (2010.01) |
| *H01L 33/42* | (2010.01) |

(52) U.S. Cl.
CPC .............. *H01L 33/22* (2013.01); *H01L 33/32* (2013.01); *H01L 33/42* (2013.01); *H01L 2933/0016* (2013.01)

(58) Field of Classification Search
CPC .......... H01L 33/22; H01L 33/32; H01L 33/42
(Continued)

(56) References Cited

U.S. PATENT DOCUMENTS 7,285,800 B2 * 10/2007 Lai .......................... H01L 33/22
257/79
7,863,599 B2 * 1/2011 Kim ..................... H01L 33/465
257/13
(Continued)

FOREIGN PATENT DOCUMENTS

JP  2005-191326  7/2005
JP  2015-082655  4/2015
(Continued)

OTHER PUBLICATIONS

Schujman et. al, "GaN-ready aluminum nitride substrates for cost-effective, very low dislocation density III-nitride LEDs", Final Scientific/Technical Report, Reporting period: Jun. 15, 2008-Oct. 15, 2010; Prepared by: Sandra B. Schujman and Leo J. Schowalter; Report issued: Jan. 2011; (Year: 2011).*

(Continued)

*Primary Examiner* — Allen L Parker
*Assistant Examiner* — Charles N Ausar-El
(74) *Attorney, Agent, or Firm* — KED & Associates LLP

(57) ABSTRACT

An embodiment comprises: a light emitting structure comprising a substrate, a first conductive type semiconductor layer arranged on the substrate, a second conductive type semiconductor layer arranged on the first conductive type semiconductor layer, and an active layer arranged between the first conductive type semiconductor layer and the second conductive type semiconductor layer; and a light transmissive conduction layer arranged on the second conductive type semiconductor layer. The light transmissive conduction layer comprises: a first conductive oxide layer arranged on the first conductive type semiconductor layer and comprising at least one first metal element and oxygen; and a second conductive oxide layer arranged on the first conductive oxide layer and comprising a compound consisting of the (Continued)

same metal element as the at least one first metal element, a second metal element, and oxygen.

16 Claims, 15 Drawing Sheets

(58) Field of Classification Search
USPC .......................................................... 257/99
See application file for complete search history.

(56) References Cited

U.S. PATENT DOCUMENTS

| | | | | |
|---|---|---|---|---|
| 8,525,215 | B2* | 9/2013 | Choi | H01L 33/22 |
| | | | | 257/99 |
| 8,633,501 | B2* | 1/2014 | Ou | H01L 33/32 |
| | | | | 257/98 |
| 9,362,454 | B2* | 6/2016 | Kim | H01L 33/06 |
| 9,385,273 | B2* | 7/2016 | Totani | H01L 33/10 |
| 9,548,420 | B2* | 1/2017 | Tu | H01L 33/22 |
| 9,733,417 | B2* | 8/2017 | Jang | F21V 5/04 |
| 9,755,104 | B2* | 9/2017 | Chung | H01L 33/0062 |
| 10,069,038 | B2* | 9/2018 | Kim | H01L 33/16 |
| 2007/0029568 | A1 | 2/2007 | Choo et al. | |
| 2010/0117115 | A1* | 5/2010 | Tanaka | H01L 33/0093 |
| | | | | 257/103 |
| 2012/0097922 | A1* | 4/2012 | Masuya | H01L 33/42 |
| | | | | 257/13 |
| 2012/0187446 | A1* | 7/2012 | Ito | H01L 33/16 |
| | | | | 257/99 |
| 2013/0328011 | A1* | 12/2013 | Teranishi | H01L 33/32 |
| | | | | 257/13 |
| 2014/0124734 | A1* | 5/2014 | Lin | H01L 21/0237 |
| | | | | 257/13 |
| 2014/0166980 | A1* | 6/2014 | Goda | H01L 33/06 |
| | | | | 257/13 |
| 2015/0008475 | A1* | 1/2015 | Lu | H01L 33/38 |
| | | | | 257/99 |
| 2015/0115309 | A1 | 4/2015 | Hsu et al. | |
| 2016/0013367 | A1* | 1/2016 | Hu | H01L 33/42 |
| | | | | 257/76 |
| 2017/0069791 | A1* | 3/2017 | Yang | H01L 33/22 |
| 2017/0125640 | A1* | 5/2017 | Kim | H01L 33/38 |

FOREIGN PATENT DOCUMENTS

| | | |
|---|---|---|
| JP | 2015-1855348 | 10/2015 |
| KR | 10-0632668 | 10/2006 |
| KR | 2014-0141003 | 12/2014 |
| KR | 2015-0126475 | 11/2015 |
| WO | WO 2015-037182 | 3/2017 |

OTHER PUBLICATIONS

Zhao, Analysis of Light Extration Efficiency Enhancement for Deep Ulatraviolet and Visible Light-Emitting Diodes with III-Nitride Micro-Domes, Submitted in partial fulfillment of requirements for the degree of Master of Science; Jan. 2013. (Year: 2013).*
International Search Report (with English Translation) and Written Opinion (with English Translation) dated Aug. 8, 2017 issued in Application No. PCT/KR2017/004719.

* cited by examiner

| Case | VF3 | WD | Po | ΔVf | ΔPo |
|------|------|------|------|------|------|
| Case 3 | 2.865 | 454.8 | 138.3 | -0.019 | 102.6 % |
|  | 92 % | 95 % | 87 % |  |  |
| Case 4 | 2.846 | 454.8 | 141.9 |  |  |
|  | 90 % | 95 % | 88 % |  |  |

LIGHT EMITTING DEVICE THAT INCLUDES A LIGHT-TRANSMISSIVE CONDUCTIVE LAYER

CROSS-REFERENCE TO RELATED PATENT APPLICATIONS

This application is a U.S. National Stage Application under 35 U.S.C. 071 of PCT Application No. PCT/KR2017/004719, filed May 4, 2017, which claims priority to Korean Patent Application No. 10-2016-0056223, filed May 9, 2016, whose entire disclosures are hereby incorporated by reference.

TECHNICAL FIELD

Embodiments relate to a light-emitting device.

BACKGROUND ART

Group III-V nitride semiconductors, such as GaN, have attracted attention as a core material for semiconductor optical devices, such as a light-emitting diode (LED), a laser diode (LD), and a solar cell, thanks to the excellent physical and chemical properties thereof.

A nitride semiconductor light-emitting device has been used as a backlight of a cellular phone or as a light source for various kinds of products, such as a keypad, an electric bulletin board, and a lighting apparatus. In particular, with the evolution of digital products, the demand for nitride semiconductor optical devices that exhibit higher luminance and reliability has increased.

A light-emitting diode may include a light-emitting structure grown on a sapphire substrate. The light-emitting structure may include an n-type semiconductor layer, an active layer, and a p-type semiconductor layer. In general, the active layer may have a multi-quantum-well structure capable of constraining electrons.

DISCLOSURE

Technical Problem

Embodiments provide a light-emitting device, the operating voltage of which is reduced and the light extraction efficiency of which is improved.

Technical Solution

In one embodiment, a light-emitting device includes a substrate, a light-emitting structure disposed on the substrate, the light-emitting structure including a first conductive semiconductor layer, an active layer, and a second conductive semiconductor layer, and a light-transmissive conductive layer disposed on the second conductive semiconductor layer, wherein the light-transmissive conductive layer includes a first conductive oxide layer disposed on the second conductive semiconductor layer, the first conductive oxide layer including at least one first metal element and oxygen, and a second conductive oxide layer disposed on the first conductive oxide layer, the second conductive oxide layer being made of a compound of a metal element identical to the at least one first metal element, a second metal element, and oxygen.

The second metal element may have lower Gibbs free energy than the first metal element.

The second metal element may be coupled to oxygen dangling bonds of the second conductive oxide layer.

The at least one first metal element may be indium and tin, and the second metal element may be aluminum.

The second conductive oxide layer may include at least one of a compound of aluminum and oxygen, a compound of aluminum, indium, tin, and oxygen, a compound of aluminum, indium, and oxygen, or a compound of aluminum, tin, and oxygen.

The first conductive oxide layer may be made of any one of TO (Tin Oxide), IZO (Indium Zinc Oxide), ITZO (Indium Tin Zinc Oxide), IGZO (Indium Gallium Zinc Oxide), IGTO (Indium Gallium Tin Oxide), ATO (Antimony tin Oxide), and GZO (Gallium Zinc Oxide), and the second metal element may be Al, K, Zn, Cr, Mn, V, Si, Ti, U, Li, Mg, or Ca.

The second conductive oxide layer may have a smaller thickness than the first conductive oxide layer. The ratio of the thickness of the second conductive oxide layer to the thickness of the first conductive oxide layer may range from 1:1.5 to 1:5.25.

In another embodiment, a light-emitting device includes a substrate, a light-emitting structure disposed on the substrate, the light-emitting structure including a first conductive semiconductor layer, an active layer, and a second conductive semiconductor layer, and a light-transmissive conductive layer disposed on the second conductive semiconductor layer, wherein the light-transmissive conductive layer includes a first conductive oxide layer disposed on the first conductive semiconductor layer, the first conductive oxide layer including a first metal element, a second conductive oxide layer disposed on the surface of the first conductive oxide layer, the second conductive oxide layer including a plurality of grains, each of the grains being made of a compound of a metal element identical to the first metal element, a second metal element, and oxygen.

The second metal element may have lower Gibbs free energy than the first metal element.

The second metal element may be coupled to oxygen dangling bonds of the second conductive oxide layer.

Each of the grains may have a height ranging from 8 nm to 12 nm.

The second conductive oxide layer may include a first region, in which the grains are formed, and a second region located between the respective grains, the second region exposing a portion of the surface of the first conductive oxide layer.

The first metal element may be indium and tin, and the second metal element may be aluminum.

The second conductive oxide layer may include at least one of a compound of aluminum and oxygen, a compound of aluminum, indium, tin, and oxygen, a compound of aluminum, indium, and oxygen, or a compound of aluminum, tin, and oxygen.

The light-emitting device may further include an electrode disposed on the light-transmissive conductive layer.

Advantageous Effects

In embodiments, it is possible to reduce the operating voltage of a light-emitting device and to improve the light extraction efficiency of the light-emitting device.

DESCRIPTION OF DRAWINGS

FIG. 6b is an enlarged view showing a dotted-line part of FIG. 6a;

BEST MODE

Reference will now be made in detail to embodiments, examples of which are illustrated in the accompanying drawings. In the following description of the embodiments, it will be understood that, when an element, such as a layer (film), a region, a pattern, or a structure is referred to as being "on" or "under" another element, such as a substrate, a layer (film), a region, a pad, or a pattern, it can be "directly" on or under another element or can be "indirectly" formed such that an intervening element is also present. In addition, terms such as "on" or "under" should be understood on the basis of the drawings. Wherever possible, the same reference numbers will be used throughout the drawings to refer to the same or like parts.

Figure 1:
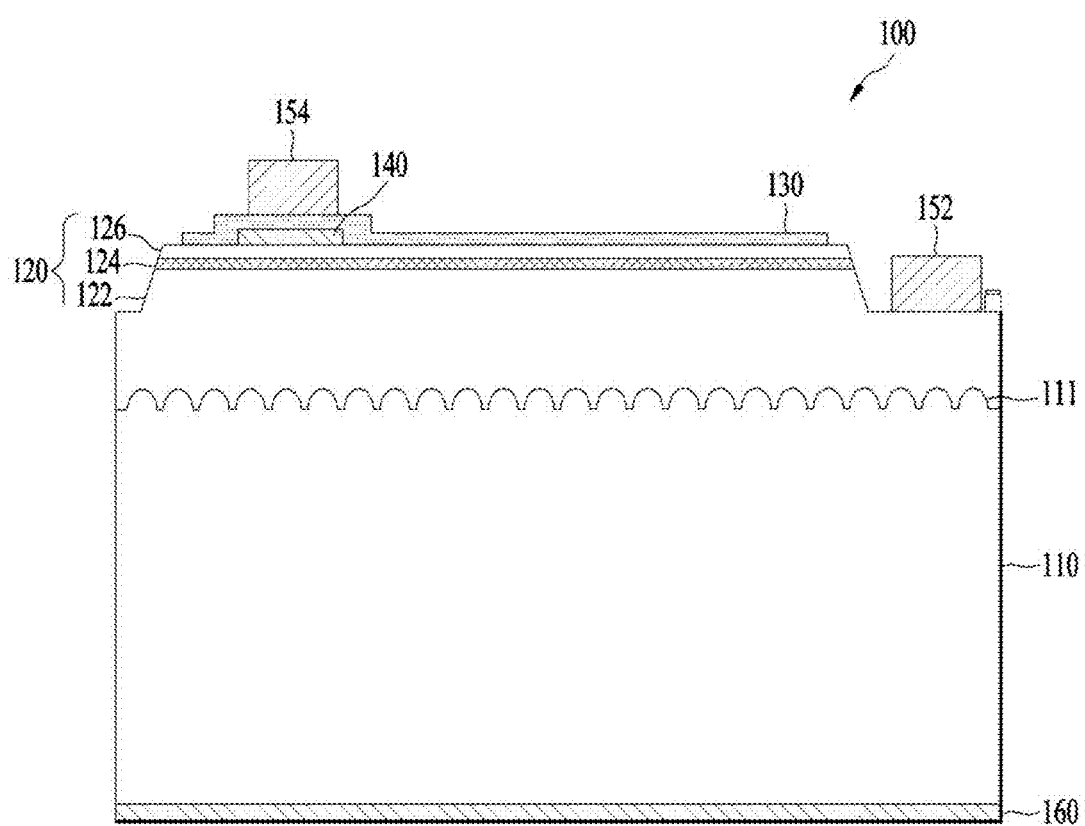
FIG. 1 is a sectional view showing a light-emitting device according to an embodiment.

FIG. 1 is a sectional view showing a light-emitting device 100 according to an embodiment.

Referring to FIG. 1, the light-emitting device 100 includes a substrate 110, a light-emitting structure 120, a light-transmissive conductive layer 130, a current-blocking layer 140, a first electrode 152, a second electrode 154, and a reflective member 160.

The substrate 110 is a substrate that is suitable for growing a single-crystal nitride semiconductor. For example, the substrate 110 may be any one of a sapphire substrate, a silicon (Si) substrate, a zinc oxide (ZnO) substrate, and a nitride semiconductor substrate, or may be a template substrate in which at least one of GaN, InGaN, AlGaN, or AlInGaN is stacked.

In order to improve light extraction efficiency, a concave and convex portion 111 may be formed in the surface of the substrate 110. For example, the substrate 110 may be a patterned sapphire substrate (PSS) having a concave and convex portion 111 formed therein. However, the disclosure is not limited thereto.

The light-emitting structure 120 is disposed on the substrate 110 for generating light.

The light-emitting structure 120 may include a first conductive semiconductor layer 122, an active layer 124, and a second conductive semiconductor layer 126. For example, the light-emitting structure 120 may include a first conductive semiconductor layer 122 disposed on the substrate 110, a second conductive semiconductor layer 126 disposed on the first conductive semiconductor layer 122, and an active layer 124 disposed between the first conductive semiconductor layer 122 and the second conductive semiconductor layer 126.

The first conductive semiconductor layer 122 is disposed on the substrate 110. The first conductive semiconductor layer 122 may be made of a group III-V or II-VI compound semiconductor, and may be doped with a first conductive dopant.

For example, the first conductive semiconductor layer 122 may be made of a semiconductor having the formula $In_xAl_yGa_{1-x-y}N$ ($0 \le x \le 1$, $0 \le y \le 1$, $0 \le x+y \le 1$). For example, the first conductive semiconductor layer 122 may include any one of InAlGaN, GaN, AlGaN, InGaN, AlN, and InN, and may be doped with an n-type dopant (e.g. Si, Ge, Se, or Te).

Although not shown in FIG. 1, a layer using a group II-VI compound semiconductor or a pattern, for example, at least one of a ZnO layer (not shown), a buffer layer (not shown), or an undoped semiconductor layer (not shown) may be formed between the substrate 110 and the first conductive semiconductor layer 122.

The buffer layer or the undoped semiconductor layer may be formed using a group III-V compound semiconductor, and may have a single-layer or multi-layer structure. The buffer layer may reduce a difference in the lattice constant between the light-emitting structure 120 and the substrate 110, and the semiconductor layer may be made of an undoped GaN-based semiconductor.

Here, undoped GaN may grow as unintentionally doped GaN (hereinafter, referred to as "UID GaN"), especially n-type UID GaN. For example, an N vacancy, in which N (sodium) is deficient, may occur even in a region to which no n-type dopant is supplied during a GaN growth process. In the case in which the incidence of N vacancies increases, the concentration of extra electrons increases, whereby UID GaN may exhibit electrical properties similar to those in the case in which GaN is doped with an n-type dopant during a process of manufacturing UID GaN, although not intended.

The active layer 124 is disposed on the first conductive semiconductor layer 122.

The active layer 124 may generate light using energy generated during the recombination of electrons and holes provided from the first conductive semiconductor layer 122 and the second conductive semiconductor layer 126.

The active layer 124 may be made of a group III-V or II-VI semiconductor compound, for example, a group III-V or II-VI compound semiconductor, and may have a single-well structure, a multi-well structure, a quantum-wire structure, a quantum-dot structure, or a quantum-disk structure.

For example, the active layer 124 may have the formula $In_xAl_yGa_{1-x-y}N$ ($0 \leq x \leq 1$, $0 \leq y \leq 1$, $0 \leq x+y \leq 1$). In the case in which the active layer 124 has a quantum-well structure, the active layer 124 may include a well layer (not shown) having the formula $In_xAl_yGa_{1-x-y}N$ ($0 \leq x \leq 1$, $0 \leq y \leq 1$, $0 \leq x+y \leq 1$) and a barrier layer (not shown) having the formula $In_aAl_bGa_{1-a-b}N$ ($0 \leq a \leq 1$, $0 \leq b \leq 1$, $0 \leq a+b \leq 1$).

The well layer has a lower energy band gap than the barrier layer. The well layer and the barrier layer may be alternately stacked at least once.

The energy band gaps of the well layer and the barrier layer may be uniform in the respective sections thereof. However, the disclosure is not limited thereto.

For example, the composition of indium (In) and/or aluminum (Al) of the well layer may be uniform, and the composition of indium (In) and/or aluminum (Al) of the barrier layer may be uniform.

Alternatively, the energy band gap of the well layer may gradually increase or decrease in a specific section, and the energy band gap of the barrier layer may gradually increase or decrease in a specific section.

Although not shown in FIG. 1, the light-emitting structure 120 may further include a superlattice layer disposed between the first conductive semiconductor layer 122 and the active layer 124 for reducing a lattice constant.

The second conductive semiconductor layer 126 is disposed on the active layer 124. The second conductive semiconductor layer 126 may be made of a group III-V or II-VI semiconductor compound, and may be doped with a second conductive dopant.

For example, the second conductive semiconductor layer 126 may be made of a semiconductor having the formula $In_xAl_yGa_{1-x-y}N$ ($0 \leq x \leq 1$, $0 \leq y \leq 1$, $0 \leq x+y \leq 1$). For example, the second conductive semiconductor layer 126 may include any one of InAlGaN, GaN, AlGaN, InGaN, AlN, and InN, and may be doped with a p-type dopant (e.g. Mg, Zn, Ca, Sr, or Ba).

Although not shown in FIG. 1, the light-emitting structure 120 may further include an electron-blocking layer disposed between the active layer 124 and the second conductive semiconductor layer 126 for preventing the overflow of electrons and holes.

In order to achieve electrical connection with the first electrode 152, a portion of the second conductive semiconductor layer 126 and a portion of the active layer 124 are removed by etching such that a portion of the first conductive semiconductor layer 122 is exposed in the light-emitting structure 120, in which the first conductive semiconductor layer 122, the active layer 124, and the second conductive semiconductor layer 126 are sequentially stacked.

The light-transmissive conductive layer 130 is disposed on the light-emitting structure 120, for example, on the second conductive semiconductor layer 126. The light-transmissive conductive layer 130 reduces total reflection and exhibits high light transmissivity, thereby improving light extraction efficiency.

The current-blocking layer 140 is disposed between the light-emitting structure 120, for example, on the second conductive semiconductor layer 126, and the light-transmissive conductive layer 130.

At least a portion of the current-blocking layer 140 may overlap the second electrode 154 in the vertical direction. Here, the vertical direction may be a direction from the first conductive semiconductor layer 122 to the second conductive semiconductor layer 126.

The current-blocking layer 140 may alleviate the concentration of current to a portion of the light-emitting structure 120 that is adjacent to the second electrode 154, thereby improving the light emission efficiency of the light-emitting device 100.

The current-blocking layer 140 may be made of an electrically insulative material, such as ZnO, $SiO_2$, SiON, $Si_3N_4$, $Al_2O_3$, or $TiO_2$. Alternatively, the current-blocking layer 140 may be made of a material that forms Schottky contact with the second conductive semiconductor layer 126.

For example, the light-transmissive conductive layer 130 may cover the side surface and the upper surface of the current-blocking layer 140.

The first electrode 152 is electrically connected to the first conductive semiconductor layer 122, and the second electrode 154 is electrically connected to the light-transmissive conductive layer 130.

The first electrode 152 may be disposed on a portion of the first conductive semiconductor layer 122, and the second electrode 154 may be disposed on a portion of the upper surface of the light-transmissive conductive layer 130. Electric power may be supplied to the light-emitting structure 120 via the first electrode 152 and the second electrode 154.

For example, each of the first electrode 152 and the second electrode 154 may include an electrode pad, to which a wire is bonded.

Each of the first electrode 152 and the second electrode 154 may be made of a metal material. For example, each of the first electrode 152 and the second electrode 154 may be made of a reflective electrode material that exhibits an ohmic property. For example, each of the first electrode 152 and the second electrode 154 may include at least one of Mg, Zn, Al, Ag, W, Cu, Ni, Cr, Ti, Pd, Jr, Sn, Ru, Pt, Au, or Hf.

For example, each of the first electrode 152 and the second electrode 154 may have a multi-layer structure including a contact layer made of Ti or Cr, a reflective layer made of Al or Ag, and a bonding layer made of Au, Sn, Ti, Cu, W, Ni, or Pt.

The reflective member 160 is disposed on the lower surface of the substrate 110 for reflecting light generated from the light-emitting structure 120. The reflective member 160 may reflect light emitted from the active layer of the light-emitting structure 120 toward the substrate 110.

The reflective member 160 may be made of a reflective metal material such as Ag or Al, or may be constituted by a distributed Bragg Reflector layer. In another embodiment, the reflective member 160 may be omitted.

Figure 2:
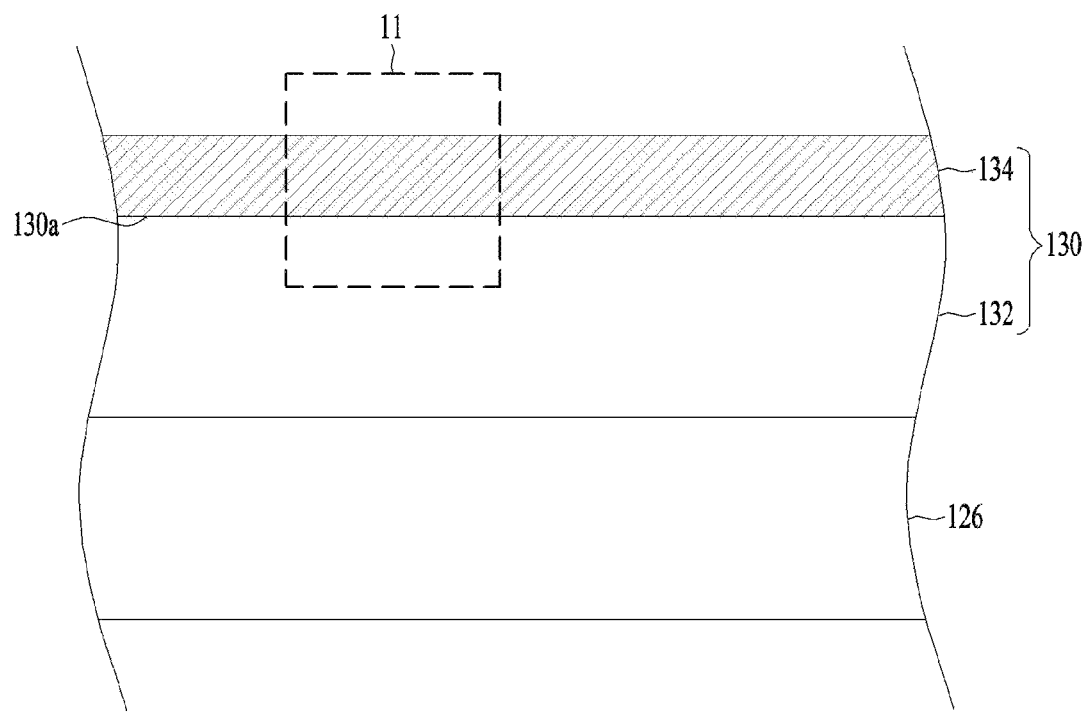
FIG. 2 is a view showing an embodiment of a light-transmissive conductive layer shown in FIG. 1.

FIG. 2 is a view showing an embodiment of the light-transmissive conductive layer 130 shown in FIG. 1.

Referring to FIG. 2, the light-transmissive conductive layer 130 may include a first conductive oxide layer 132 and a second conductive oxide layer 134, which is disposed on the first conductive oxide layer 126.

The first conductive oxide layer 132 is disposed on the second conductive semiconductor layer 132.

The first conductive oxide layer 132 may include at least one first metal element and oxygen. The first conductive oxide layer 132 may be made of a transparent conductive oxide such as ITO (Indium Tin Oxide).

In another embodiment, the first conductive oxide layer 132 may be made of any one of TO (Tin Oxide), IZO (Indium Zinc Oxide), ITZO (Indium Tin Zinc Oxide), IGZO (Indium Gallium Zinc Oxide), IGTO (Indium Gallium Tin Oxide), ATO (Antimony tin Oxide), and GZO (Gallium Zinc Oxide).

For example, the current-blocking layer 140 may be disposed between the second conductive semiconductor layer 126 and the first conductive oxide layer 132.

The second conductive oxide layer 134 is formed or disposed on the surface 130a of the first conductive oxide layer 132. The second conductive oxide layer 134 may be a transparent conductive oxide layer including a second metal element having lower Gibbs free energy than the first metal element included in the first conductive oxide layer 132.

The second conductive oxide layer 134 may include a compound of a transparent conductive oxide constituting the first conductive oxide layer 132 and a second metal element.

For example, the second conductive oxide layer 134 may include the same metal element as the first metal element of the first conductive oxide layer 132 and a second metal element. The second metal element may be coupled to oxygen dangling bonds of the second conductive oxide layer 134.

For example, the second metal element may be Al, K, Zn, Cr, Mn, V, Si, Ti, U, Li, Mg, or Ca. For example, the second metal element may be aluminum.

Figure 4A:
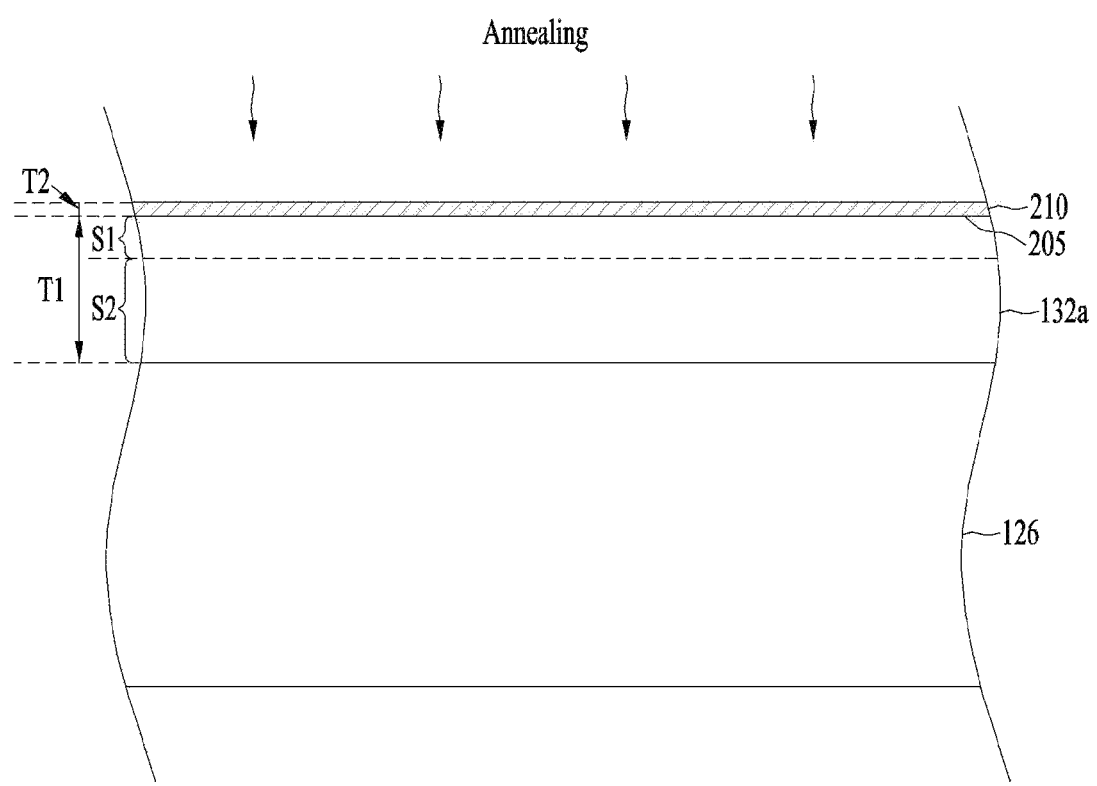
FIGS. 4a and 4b are views showing a method of forming a light-transmissive conductive layer.
Figure 4B:
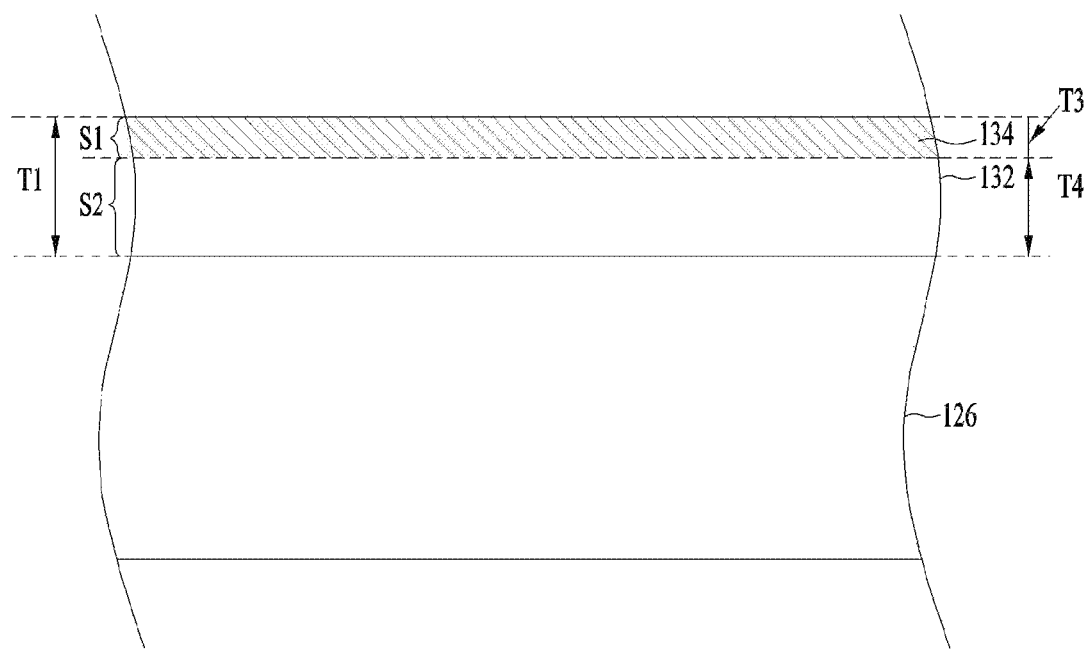

FIGS. 4a and 4b are views showing a method of forming a light-transmissive conductive layer 130.

Referring to FIGS. 1 and 4a, a light-emitting structure 120 is formed on a substrate 110, and a current-blocking layer 140 is formed on the light-emitting structure 120, for example, on a portion of the upper surface of a second conductive semiconductor layer 126.

A transparent conductive oxide 132a is formed on the upper surface of the second conductive semiconductor layer 126, on which the current-blocking layer 140 is formed. For example, the transparent conductive oxide 132a may be the same as the material for the first conductive oxide layer 132.

For example, the transparent conductive oxide 132a may be formed on the surface (e.g. the upper surface) of the second conductive semiconductor layer 126. For example, the thickness Ti of the transparent conductive oxide 132a may range from 30 nm to 50 nm. Alternatively, the thickness Ti of the transparent conductive oxide 132a may range from 40 nm to 45 nm. As another alternative, the thickness Ti of the transparent conductive oxide 132a may be 40 nm.

Subsequently, a metal thin film 210 made of a second metal element material is formed on the surface (e.g. the upper surface) of the transparent conductive oxide 132a. For example, the thickness T2 of the metal thin film 210 may range from 2 nm to 5 nm. Alternatively, the thickness T2 of the metal thin film 210 may range from 3 nm to 4 nm. As another alternative, the thickness of the metal thin film 210 may be 3 nm.

Subsequently, the transparent conductive oxide 132a, on the surface of which the metal thin film 210 is formed, undergoes an annealing process in a nitrogen atmosphere in order to couple at least one oxygen dangling bond of the transparent conductive oxide 132a to a second metal element (e.g. Al) of the metal thin film 210.

Referring to FIG. 4b, the transparent conductive oxide 132a may include a first region S1, which is adjacent to a boundary 205 between the transparent conductive oxide 132a and the metal thin film 210, and a second region S2, which is located under the first region S1.

Oxygen dangling bonds of the first region S1 of the transparent conductive oxide 132a may be coupled to the second metal element (e.g. Al) of the metal thin film 210 through the annealing process to form a second conductive oxide layer 134, which is a conductive oxide layer having a second metal element (e.g. Al) coupled thereto.

For example, the second metal element (e.g. Al) of the metal thin film 210, having a thickness ranging from 2 nm to 5 nm, may be coupled to the oxygen dangling bonds of the first region S1 of the transparent conductive oxide 132a through the annealing process to form a second conductive oxide layer 134 having a thickness ranging from 8 nm to 12 nm. For example, the thickness T3 of the second conductive oxide layer 134 may be 10 nm.

The thickness T3 of the second conductive oxide layer 134 formed through the annealing process may be 16% to 40% of the thickness T1 of the transparent conductive oxide 132a. Alternatively, the thickness T3 of the second conductive oxide layer 134 may be 20% to 30% of the thickness T1 of the transparent conductive oxide 132a.

For example, the second conductive oxide layer 134, formed through the coupling between the second metal element (e.g. Al) of the metal thin film 210 and the oxygen dangling bonds of the first region Si of the transparent conductive oxide 132a, may include a compound of aluminum and oxygen (e.g. $Al_2O_3$).

In addition, the second conductive oxide layer 134 may further include a compound of aluminum, indium, tin, and oxygen (an Al—In—Sn—O compound).

Alternatively, the second conductive oxide layer 134 may further include a compound of aluminum, indium, and oxygen (an Al—In—O compound).

As another alternative, the second conductive oxide layer 134 may further include a compound of aluminum, tin, and oxygen (an Al—Sn—O compound).

Since the second metal element (e.g. Al) of the metal thin film 210 has lower Gibbs free energy than a first metal element (e.g. In or Sn) of the transparent conductive oxide 132a, the second metal element of the metal thin film 210 may be easily coupled to oxygen dangling bonds of the transparent conductive oxide 132a.

The second region S2 of the transparent conductive oxide 132a, which is a region that is not coupled to the second metal element of the metal thin film 210, may become a first conductive oxide layer 132.

For example, the thickness T4 of the first conductive oxide layer 132 may range from 18 nm to 42 nm. Alternatively, the thickness T4 of the first conductive oxide layer 132 may be 30 nm.

The thickness T3 of the second conductive oxide layer 134 may be smaller than the thickness T4 of the first conductive oxide layer 132 (T3≤T4).

For example, the ratio of the thickness T3 of the second conductive oxide layer 134 to the thickness T4 of the first conductive oxide layer 132 (T3:T4) may range from 1:1.5 to 1:5.25. For example, the ratio of the thickness T3 of the second conductive oxide layer 134 to the thickness T4 of the first conductive oxide layer 132 (T3:T4) may be 1:4.

Figure 5A:
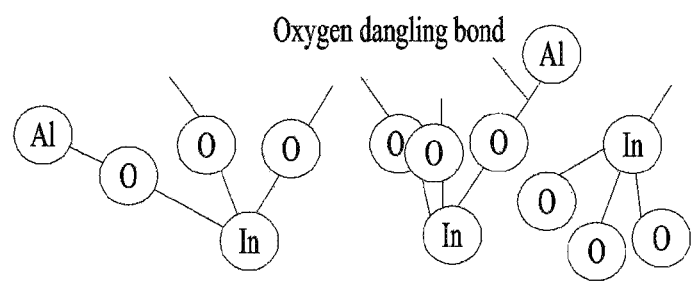
FIG. 5a is a view showing an embodiment of the coupling between oxygen dangling bonds of a first conductive oxide layer and a second metal element of a metal thin film.

FIG. 5a is a view showing an embodiment of the coupling between oxygen dangling bonds of the first conductive oxide layer 132 and the second metal element of the metal thin film 210.

Referring to FIG. 5a, any one of the dangling bonds of oxygen, coupled to indium (In), of the first region Si of the transparent conductive oxide 132a of FIG. 4a, may be coupled to the second metal element (e.g. Al) of the metal thin film 210 to form a compound of aluminum, indium, and oxygen (an Al—In—O compound).

A plurality of oxygen dangling bonds exists on the surface of the transparent conductive oxide 132a, and electron trapping occurs due to the oxygen dangling bonds.

In this embodiment, as previously described, the second metal element (e.g. Al) of the metal thin film 210 is coupled to the oxygen dangling bonds of the first region Si of the transparent conductive oxide 132a through annealing in the nitrogen atmosphere to form the oxide compounds, described with reference to FIG. 4b, whereby it is possible to reduce the number of oxygen dangling bonds on the surface of the light-transmissive conductive layer 130. In this embodiment, therefore, it is possible to reduce the resistance (e.g. the specific resistance or the surface resistance) of the light-transmissive conductive layer 130, whereby it is possible to reduce the operating voltage of the light-emitting device 100.

Figure 5B:
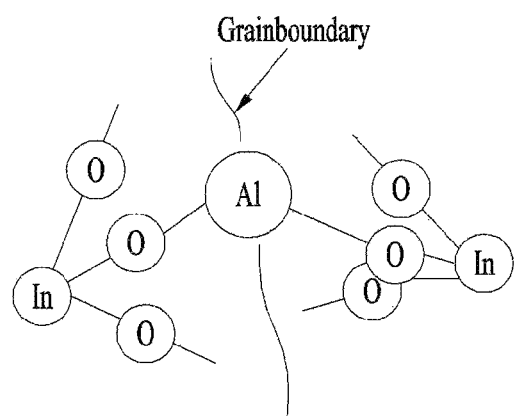
FIG. 5b is a view showing another embodiment of the coupling between oxygen dangling bonds of a first conductive oxide layer and a second metal element of a metal thin film.

FIG. 5b is a view showing another embodiment of the coupling between oxygen dangling bonds of the first conductive oxide layer 132 and the second metal element of the metal thin film 210.

Referring to FIG. 5b, a large number of grain boundary defects exist in the transparent conductive oxide 132a, since the transparent conductive oxide is polycrystalline. The crystallinity of the transparent conductive oxide 132a is deteriorated due to the grain boundary defects. The grain boundary defects may act as a factor that absorbs light or reduces light transmittance.

The second metal element (e.g. Al) of the metal thin film 210 is coupled to any one of the dangling bonds of oxygen, coupled to indium (In), of the first region Si of the transparent conductive oxide 132a and to a grain boundary of the transparent conductive oxide 132a.

Since the second metal element (e.g. Al) of the metal thin film 210 is coupled to the grain boundary of the first region S1 of the transparent conductive oxide 132a, it is possible to improve the crystallinity of the light-transmissive conductive layer 130, to prevent the absorption of light due to the grain boundary, and to improve light transmittance.

Figure 3:
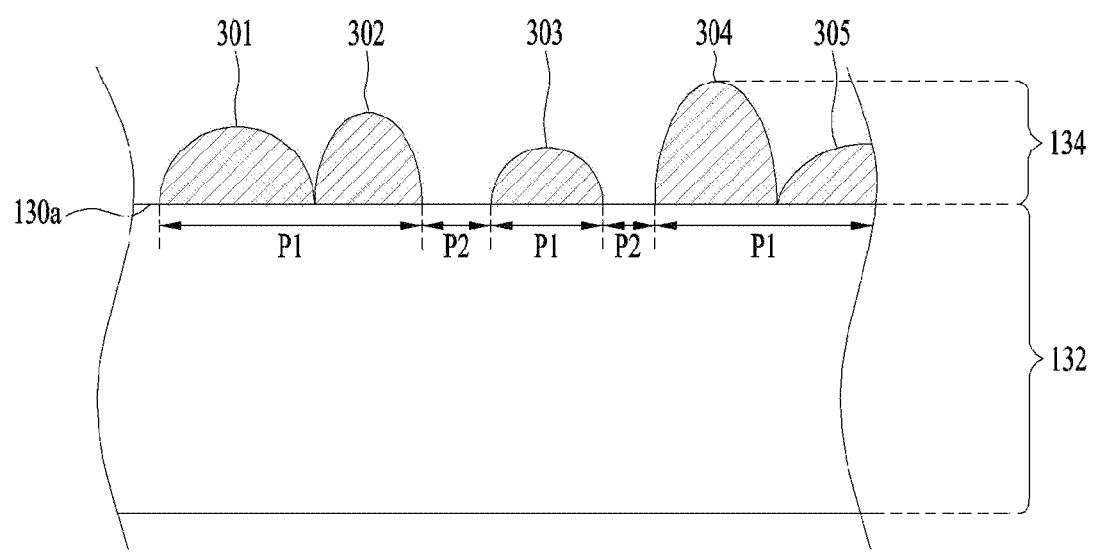
FIG. 3 is a view showing the structure of an embodiment of a second conductive oxide layer.

FIG. 3 is a view showing the structure of an embodiment of the second conductive oxide layer 134.

Referring to FIG. 3, the second conductive oxide layer 134 may have a grain structure formed on the surface of the first conductive oxide layer 132. For example, the grain structure of FIG. 3 may include grains shown in FIGS. 7a and 7b.

The second conductive oxide layer 134 may have a structure including a plurality of grains 301 to 305.

The grains 301 to 305 may be compounds in which oxygen of the transparent conductive oxide 132a is coupled to the second metal element of the metal thin film 210 through the annealing process.

For example, the grain structure of FIG. 3 may include at least one of (a) a compound of aluminum and oxygen (e.g. $Al_2O_3$), (b) a compound of aluminum, indium, tin, and oxygen (an Al—In—Sn—O compound), (c) a compound of aluminum, indium, and oxygen (an Al—In—O compound), or (d) a compound of aluminum, tin, and oxygen (an Al—Sn—O compound).

For example, each of the grains 301 to 305 may include any one of (a) a compound of aluminum and oxygen (e.g. $Al_2O_3$), (b) a compound of aluminum, indium, tin, and oxygen (an Al—In—Sn—O compound), (c) a compound of aluminum, indium, and oxygen (an Al—In—O compound), and (d) a compound of aluminum, tin, and oxygen (an Al—Sn—O compound).

The shapes and sizes of the compounds (a) to (d) may not be uniform or equal to each other, since the compounds are irregularly distributed or disposed. For example, the second conductive oxide layer 134 may include a first region P1, in which the grains 301 to 305 are formed, and a second region P2, which is located between the respective grains.

The second region P2 may be a region in which the compounds (a) to (d) are not formed. For example, the second region P2 may be a portion of the first conductive oxide layer 132 that is exposed by the grains 301 to 305.

Figure 7A:
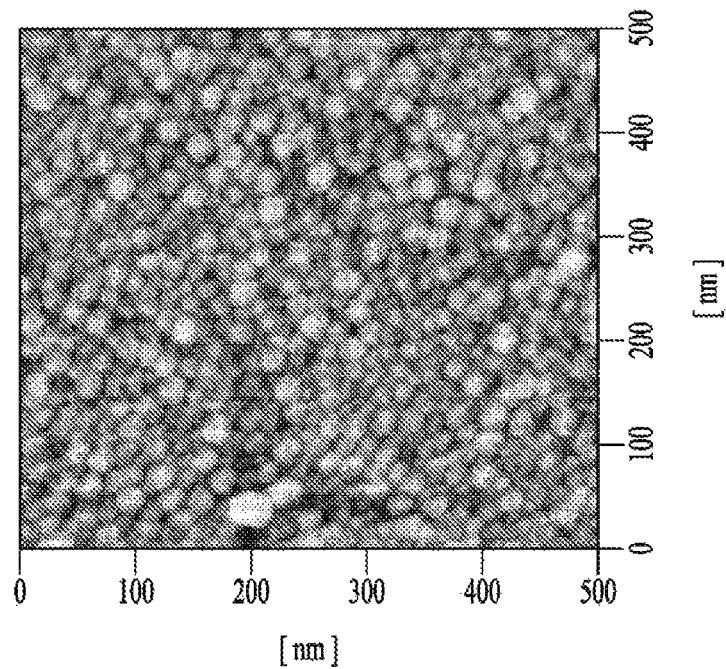
FIG. 7a is a view showing a two-dimensional image of a second conductive oxide layer acquired using an AFM.
Figure 7B:
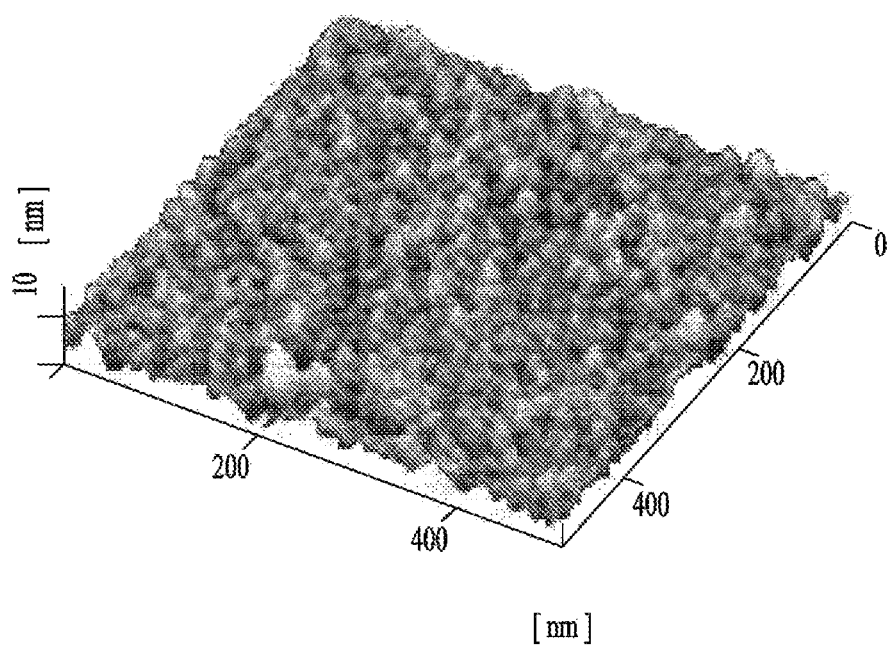
FIG. 7b is a view showing a three-dimensional image of a second conductive oxide layer acquired using an AFM.

FIG. 7a is a view showing a two-dimensional image of the second conductive oxide layer 134 acquired using an AFM (Atomic Force Microscope), and FIG. 7b is a view showing a three-dimensional image of the second conductive oxide layer 134 acquired using an AFM. In FIGS. 7a and 7b, the size (the horizontal length×the vertical length) of the image is 0.5 μm×0.5 μm.

Referring to FIGS. 7a and 7b, the second conductive oxide layer 134 may include a plurality of protruding grains formed on the surface thereof. The height of each of the grains may range from 8 nm to 12 nm. For example, the height of each of the grains may be 10 nm. Here, the height may be the distance from the surface of the first conductive oxide layer 132 to the highest point of each of the grains. For example, the thickness of the second conductive oxide layer 134 may be equal to the maximum value of the heights of the grains. However, the disclosure is not limited thereto. In another embodiment, the thickness of the second conductive oxide layer 134 may be equal to the average of the heights of the grains.

Since the grains include at least one of (a) a compound of aluminum and oxygen (e.g. $Al_2O_3$), (b) a compound of aluminum, indium, tin, and oxygen (an Al—In—Sn—O compound), (c) a compound of aluminum, indium, and oxygen (an Al—In—O compound), or a compound of aluminum, tin, and oxygen (an Al—Sn—O compound), it is possible to reduce the resistance (e.g. the specific resistance or the surface resistance) of the second conductive oxide layer 134. In addition, the number of grain boundary defects of the second conductive oxide layer 134 is reduced, whereby it is possible to improve the crystallinity of the light-transmissive conductive layer 130. In this embodiment, therefore, it is possible to reduce operating voltage and to improve light transmittance.

Figure 6A:
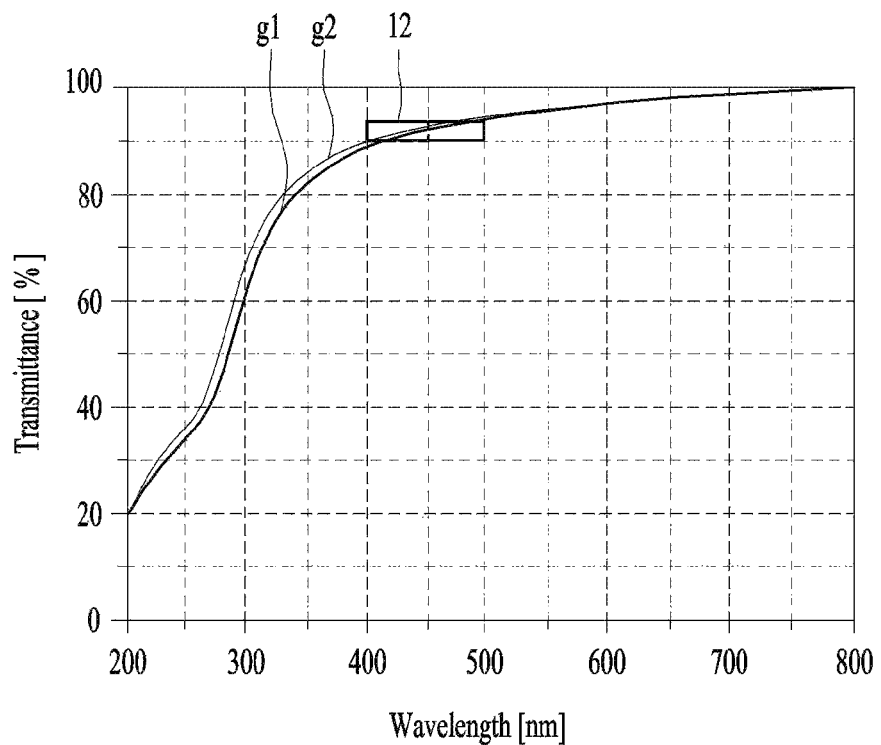
FIG. 6a is a view showing light transmittance of Case 1 and Case 2.
Figure 6B:
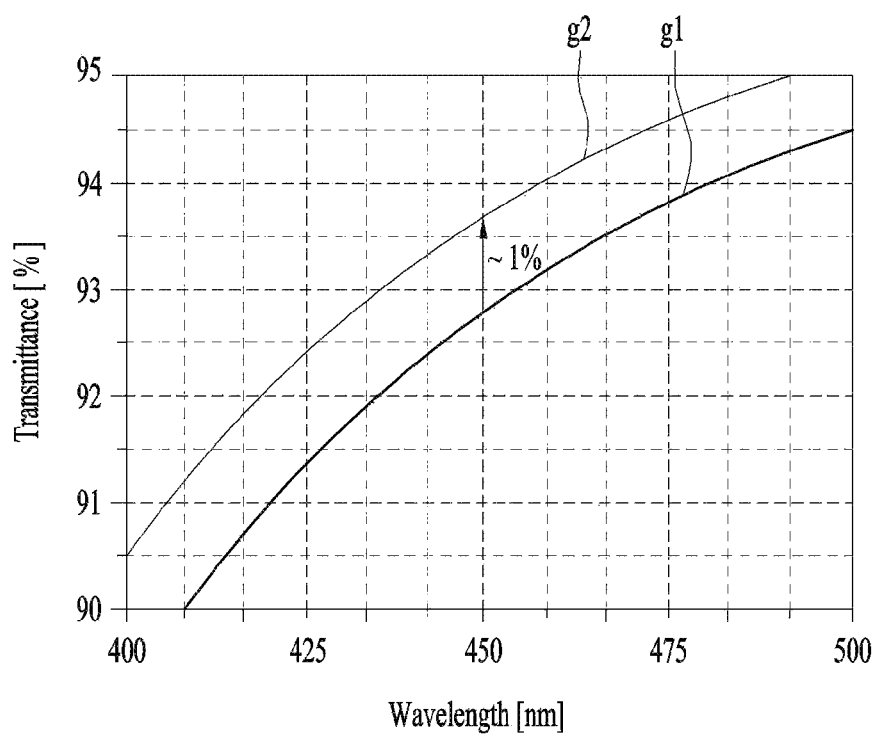

FIG. 6a is a view showing the light transmittance of Case 1 and Case 2, and FIG. 6b is an enlarged view showing a dotted-line part 12 of FIG. 6a. The dotted-line part 12 of FIG. 6b shows the transmittance of light having a wavelength range of 400 nm to 500 nm.

Case 1 is the case in which only a transparent conductive oxide 132a is formed on a sapphire substrate. Case 2 is the case in which a light-transmissive conductive layer 130, including a first conductive oxide layer 132 and a second conductive oxide layer 134, is formed on a sapphire substrate, as described with reference to FIGS. 4a and 4b.

g1 is the light transmittance of the transparent conductive oxide 132a of Case 1, and g2 is the light transmittance of the light-transmissive conductive layer 130 of Case 2. In g2, a second metal element of the second conductive oxide layer 134 is aluminum (Al), and the transparent conductive oxide 132a is ITO.

In comparison between FIGS. 6a and 6b, for light having a wavelength range of 400 nm to 500 nm, light transmittance of g2 is 1% more higher than that of g1.

Figure 8A:
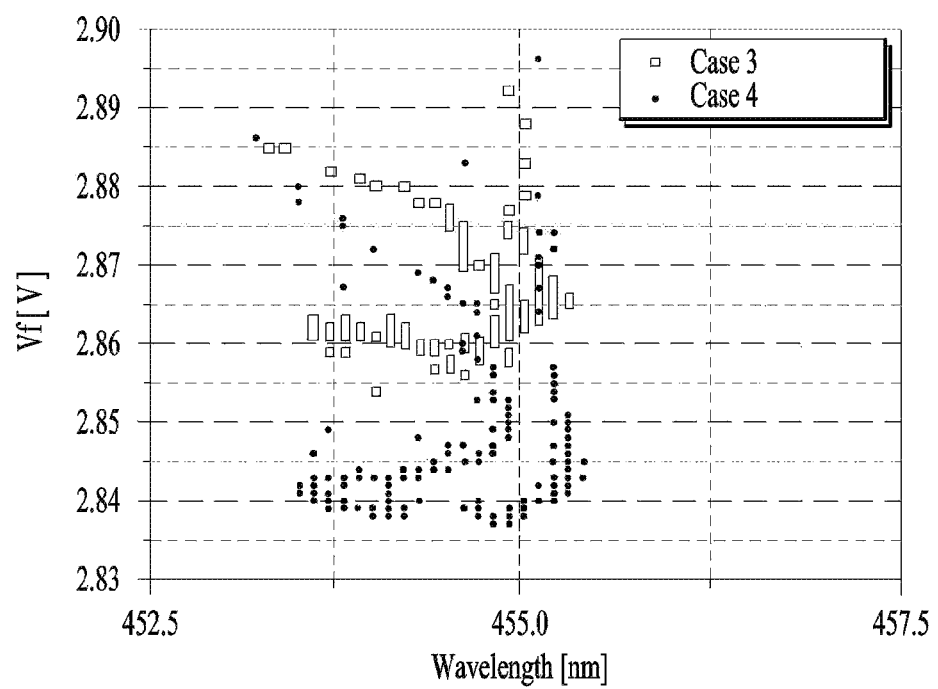
FIG. 8a is a view showing operating voltages of Case 3 and Case 4.
Figure 8B:
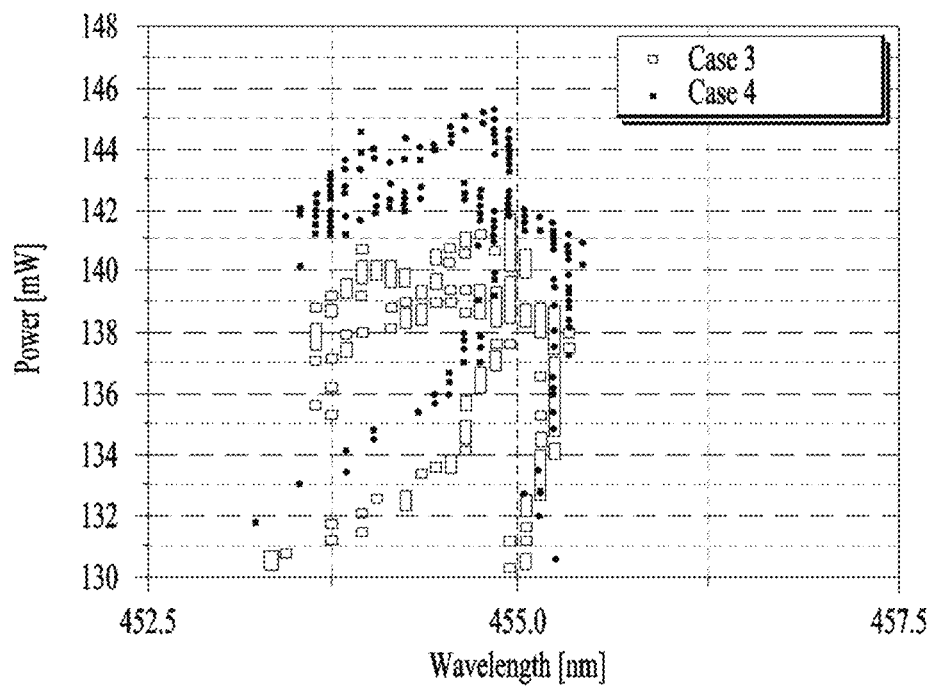
FIG. 8b is a view showing optical outputs of Case 3 and Case 4.

FIG. 8a is a view showing operating voltages of Case 3 and Case 4, and FIG. 8b is a view showing optical outputs of Case 3 and Case 4.

Case 3 shows the operating voltage of a light-emitting device including a light-transmissive conductive layer made of only ITO, and Case 4 shows the operating voltage of a light-emitting device including a light-transmissive conductive layer 130 according to an embodiment. Case 3 and Case 4 are different from each other only with respect to the structure of the light-transmissive conductive layer. Case 3 and Case 4 are identical to each other in terms of the structure of the other components of the light-emitting device and experimental conditions for measuring the operating voltage.

Referring to FIG. 8a, the operating voltage of Case 4 is lower than that of Case 3. In addition, referring to FIG. 8b, the optical output of Case 4 is higher than that of Case 3.

Figure 9A:
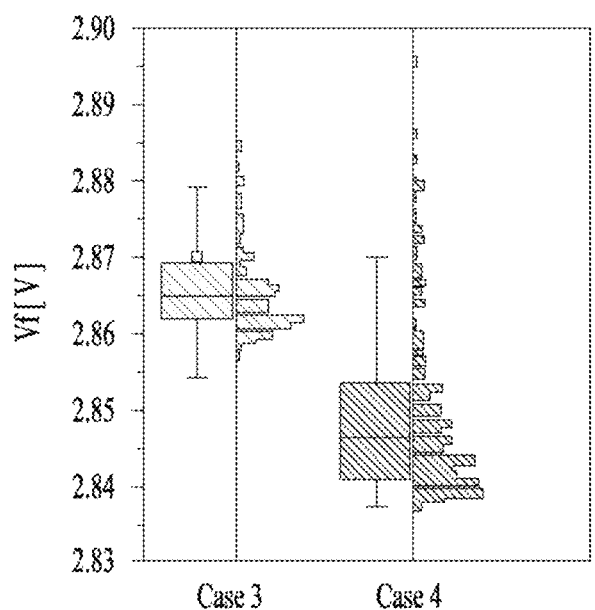
FIG. 9a is a view showing the dispersion of operating voltages of Case 3 and Case 4.
Figures 9B, 10:
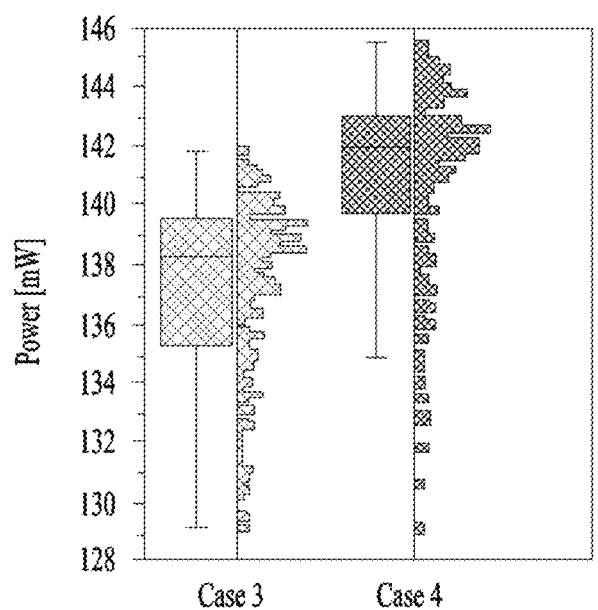
FIG. 9b is a view showing the dispersion of optical outputs of Case 3 and Case 4.
FIG. 10 is a table showing the difference between operating voltages and the difference between optical outputs of Case 3 and Case 4.

FIG. 9a is a view showing the dispersion of operating voltages of Case 3 and Case 4, and FIG. 9b is a view showing the dispersion of optical outputs of Case 3 and Case 4.

Referring to FIG. 9a, most of the operating voltages of light-emitting devices of Case 4 are distributed so as to have lower values than the operating voltages of light-emitting devices of Case 3. In addition, referring to FIG. 9b, most of the optical outputs of the light-emitting devices of Case 4 are distributed so as to have higher values than the optical outputs of the light-emitting devices of Case 3.

FIG. 10 is a table showing the difference ΔVf between operating voltages VF3 and the ratio ΔPo of optical outputs of Case 3 and Case 4.

In FIG. 10, the light-emitting devices of Case 3 and Case 4 have the same wavelength WD. In FIG. 10, the operating voltages VF3 and the optical outputs Po of Case 3 and Case 4 may be the averages of experimental data values.

Referring to FIG. 10, a value obtained by subtracting the operating voltage of Case 3 from the operating voltage of Case 4 is −0.019[V]. That is, the operating voltage of Case 4 is lower than that of Case 3.

The optical output of Case 4 may be 102.6% of that of Case 3. That is, the optical output of Case 4 is higher than that of Case 3.

A metal thin film 210, including a second metal element having lower Gibbs free energy than the first metal element included in the first conductive oxide layer 132, may be formed on the surface of the first conductive oxide layer 132, and the second metal element is coupled to oxygen dangling bonds of the first conductive oxide layer 132 through an annealing process in a nitrogen atmosphere to form a second conductive oxide layer 134, which is a compound of the second metal element and the conductive oxide.

In this embodiment, the resistance of the light-transmissive conductive layer 130 is reduced by the second conductive oxide layer 134, whereby it is possible to reduce operating voltage and to improve the crystallinity of the light-transmissive conductive layer 130. Consequently, it is possible to improve light transmittance.

Figure 11:
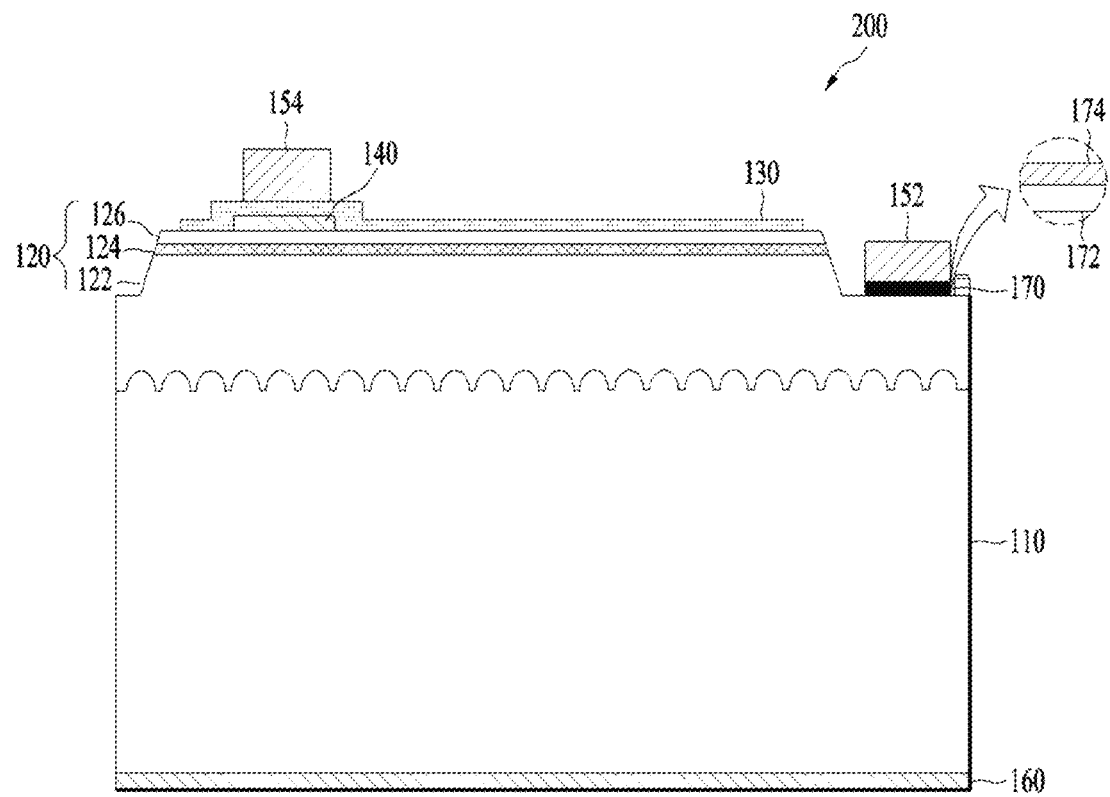
FIG. 11 is a sectional view showing a light-emitting device according to another embodiment.

FIG. 11 is a sectional view showing a light-emitting device 200 according to another embodiment. The same reference numerals as in FIG. 1 indicate the same components, a description of which will be briefly made or omitted.

Referring to FIG. 11, the light-emitting device 200 may further include a light-transmissive conductive layer 170, compared to the light-emitting device 100 shown in FIG. 1.

The light-transmissive conductive layer 170 may be disposed between the first conductive semiconductor layer 126 and the first electrode 152.

The light-transmissive conductive layer 170 may include a first conductive oxide layer 172 and a second conductive oxide layer 174.

A description of the first conductive oxide layer 132 made with reference to FIGS. 2 to 10 may be applied to the first conductive oxide layer 172 shown in FIG. 11, and a description of the second conductive oxide layer 134 may be applied to the second conductive oxide layer 174 shown in FIG. 11.

By the provision of the light-transmissive conductive layer 170, it is possible to reduce the operating voltage of the light-emitting device 200 according to this embodiment and to improve the light extraction efficiency thereof.

Figure 12:
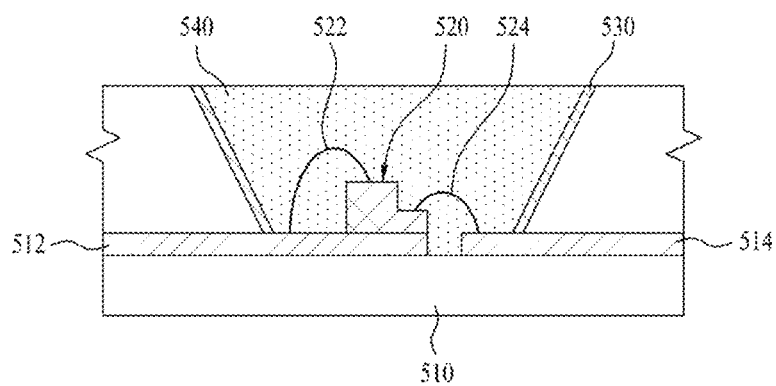
FIG. 12 is a view showing a light-emitting device package according to an embodiment.

FIG. 12 is a view showing a light-emitting device package according to an embodiment.

Referring to FIG. 12, the light-emitting device package includes a package body 510, a first metal layer 512, a second metal layer 514, a light-emitting device 520, a first wire 522, a second wire 524, a reflecting plate 530, and a resin layer 540.

The package body 510 has a structure in which a cavity is formed in one side thereof.

The sidewall of the cavity may be inclined. The package body 510 may be constituted by a substrate having high insulation or thermal conductivity, such as a silicon-based wafer level package, a silicon substrate, a silicon carbide (SiC), or aluminum nitride (AlN), and may have a structure in which a plurality of substrates is stacked. This embodiment is not limited in terms of the material, structure, and shape of the package body.

The first metal layer 512 and the second metal layer 514 are disposed on the surface of the package body 510 so as to be electrically separated from each other in consideration of heat dissipation or installation of the light-emitting device. The terms "first and second lead frames" may be used instead of the first and second metal layers 512 and 514.

The light-emitting device 520 is electrically connected to the first metal layer 512 and to the second metal layer 514 via the first wire 522 and the second wire 524, respectively.

For example, the first wire 522 may electrically connect the second electrode 154 of the light-emitting device 100 or 200 shown in FIGS. 1 and 11 to the first metal layer 512, and the second wire 524 may electrically connect the first electrode 152 to the second metal layer 514.

The reflecting plate 530 is formed on the sidewall of the cavity in the package body 510 for guiding light emitted from the light-emitting device 520 in a predetermined direction. The reflecting plate 530 is made of a light-reflective material. For example, the reflecting plate 530 may be a metal coating or a metal thin leaf.

The resin layer 540 surrounds the light-emitting device 520, which is located in the cavity formed in the package body 510, for protecting the light-emitting device 520 from the external environment. The resin layer 540 may be made of a colorless transparent polymer resin material, such as epoxy or silicone. The resin layer 540 may include a phosphor, which is capable of changing the wavelength of light emitted from the light-emitting device 520.

A plurality of light-emitting device packages, one of which is shown in FIG. 12, is arrayed on a substrate, and optical members, such as a light guide plate, a prism sheet, and a diffusion sheet, may be disposed in the optical path of the light-emitting device packages. The light-emitting device packages, the substrate, and the optical members may function as a backlight unit.

Another embodiment may provide a display apparatus, an indication apparatus, or a lighting system including the light-emitting device or the light-emitting device package according to a corresponding one of the previous embodiments. For example, the lighting system may include a lamp or a streetlight.

Figure 13:
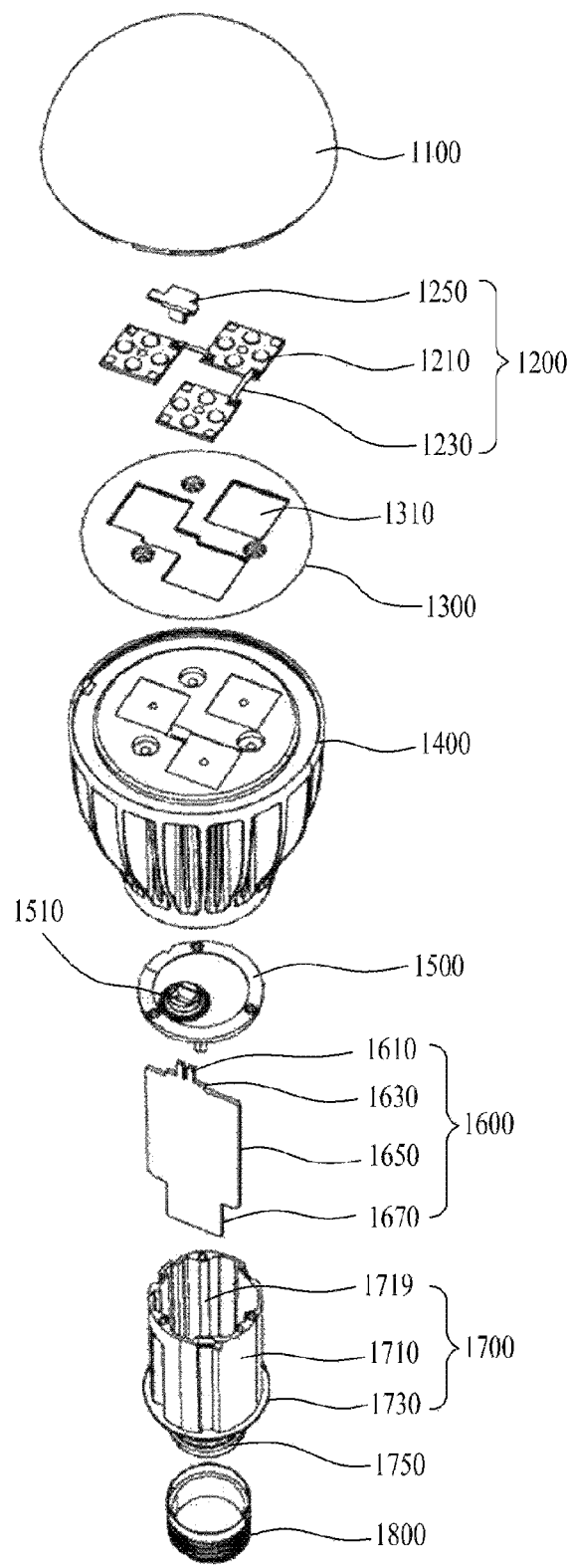
FIG. 13 is a view showing a lighting apparatus according to an embodiment.

FIG. 13 is a view showing a lighting apparatus according to an embodiment.

Referring to FIG. 13, the lighting apparatus may include a cover 1100, a light source module 1200, a heat sink 1400, a power supply 1600, an inner case 1700, and a socket 1800.

In addition, the lighting apparatus according to this embodiment may further include at least one of a member 1300 or a holder 1500.

The cover 1100 may be formed in the shape of a bulb or a hemisphere. The cover 1100 may be hollow. A portion of the cover 1100 may be open. The cover 1100 may be optically coupled to the light source module 1200. For example, the cover 1100 may diffuse, scatter, or excite the light emitted from the light source module 1200. The cover 1100 may be a kind of optical member. The cover 1100 may be coupled to the heat sink 1400. The cover 1100 may have a coupling part coupled to the heat sink 1400.

The inside of the cover 1100 may be coated with a milky paint. The milky paint may include a diffusion material for diffusing light. The inside of the cover 110 may have surface roughness greater than that of the outside of the cover 1100 such that light emitted from the light source module 1200 can be sufficiently scattered and diffused before being discharged outwards.

The cover 1100 may be made of glass, plastic, polypropylene (PP), polyethylene (PE), or polycarbonate (PC). Polycarbonate exhibits high lightfastness, heat resistance, and strength. The cover 1100 may be transparent such that the light source module 1200 is visible from outside the cover. However, the disclosure is not limited thereto. The cover may be opaque. The cover 1100 may be formed by blow molding.

The light source module 1200 may be disposed at one surface of the heat sink 1400. Consequently, heat generated from the light source module 1200 may be conducted to the heat sink 1400. The light source module 1200 may include light sources 1210, a connection plate 1230, and a connector 1250. Each of the light sources 1210 may include the light-emitting device 100 or 200 according to each embodiment or the light-emitting device package shown in FIG. 12.

The member 1300 may be disposed on the upper surface of the heat sink 1400. The member 1300 has guide holes 1310, through which the light sources 1210 and the connector 1250 are inserted. The guide holes 1310 may correspond to or may be aligned with substrates of the light sources 1210 and the connector 1250.

A light-reflective material may be applied to or coated on the surface of the member 1300.

For example, white paint may be applied to or coated on the surface of the member 1300. The member 1300 reflects light reflected by the inside of the cover 1100 and returning to the light source module 1200 such that the light is directed to the cover 1100, thereby improving the light emission efficiency of the lighting apparatus according to this embodiment.

The member 1300 may be formed of an insulative material. The connection plate 1230 of the light source module 1200 may include an electrically conductive material, by which an electrical connection between the heat sink 1400 and the connection plate 1230 may be achieved. The member 1300 may be formed of an insulative material for preventing an electrical short circuit between the connection plate 1230 and the heat sink 1400. The heat sink 1400 dissipates the heat generated from the light source module 1200 and the heat generated from the power supply 1600.

The holder 1500 covers a reception recess 1719 of an insulative part 1710 of the inner case 1700. Consequently, the power supply 1600 received in the insulative part 1710 of the inner case 1700 may be hermetically sealed. The holder 1500 may have a guide protrusion 1510 formed thereon. The guide protrusion 1510 may have therein a hole through which a protrusion 1610 of the power supply 1600 extends.

The power supply 1600 processes or converts an external electrical signal, and supplies the processed or converted signal to the light source module 1200. The power supply 1600 is received in the reception recess 1719 of the inner case 1700, and is hermetically sealed in the inner case 1700 by the holder 1500. The power supply 1600 may further include a guide 1630, a base 1650, and an extension 1670, in addition to the protrusion 1610.

The guide 1630 may be formed in a shape protruding outwards from one side of the base 1650. The guide 1630 may be inserted into the holder 1500. A plurality of components may be disposed on one surface of the base 1650. The components may include a direct-current converter for converting alternating current power, supplied from an external power source, into direct-current power, a drive chip for controlling the driving of the light source module 1200, and an electrostatic discharge (ESD) protection device for protecting the light source module 1200. However, the disclosure is not limited thereto.

The extension 1670 may be formed in a shape that protrudes outwards from the other side of the base 1650. The extension 1670 may be inserted into a connection part 1750 of the inner case 1700 to receive an external electrical signal. For example, the extension 1670 may have a width equal to or less than that of the connection part 1750 of the inner case 1700. One end of a positive lead and one end of a negative lead may be electrically connected to the extension 1670, and the other end of the positive lead and the other end of the negative lead may be electrically connected to the socket 1800.

A molding part may be disposed in the inner case 1700 in addition to the power supply 1600. The molding part, which is formed by solidifying molding liquid, may fix the power supply 1600 in the inner case 1700.

Figure 14:
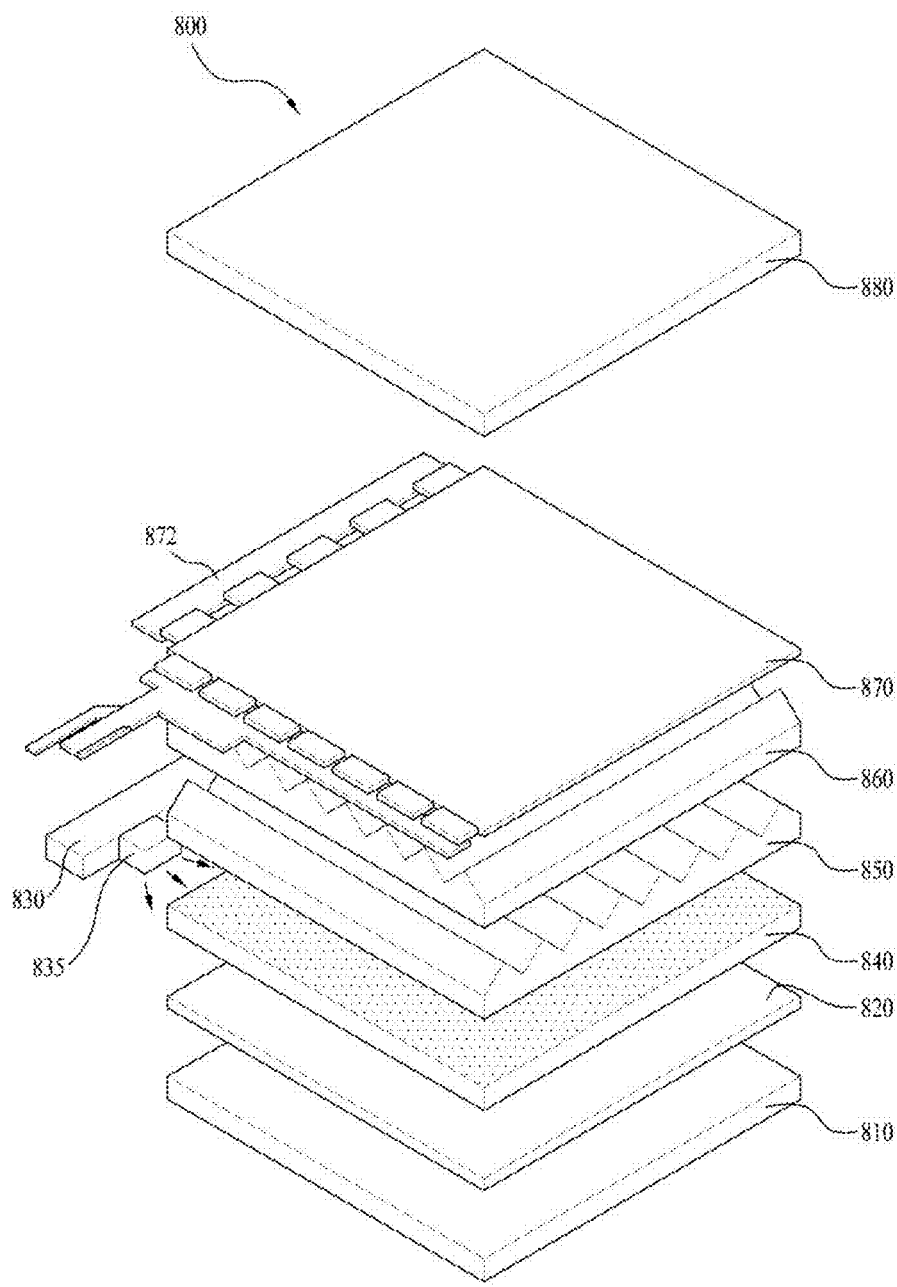
FIG. 14 is a view showing a display apparatus according to an embodiment.

FIG. 14 is a view showing a display apparatus 800 according to an embodiment.

Referring to FIG. 14, the display apparatus 800 may include a bottom cover 810, a reflecting plate 820 disposed on the bottom cover 810, a light-emitting module 830 and 835 for emitting light, a light guide plate 840 disposed in front of the reflecting plate 820 for guiding the light emitted from the light-emitting module 830 and 835 to the front of the display apparatus, an optical sheet, including prism sheets 850 and 860, disposed in front of the light guide plate 840, a display panel 870 disposed in front of the optical sheet, an image signal output circuit 872 connected to the display panel 870 for supplying an image signal to the display panel 870, and a color filter 880 disposed in front of the display panel 870. The bottom cover 810, the reflecting plate 820, the light-emitting module 830 and 835, the light guide plate 840, and the optical sheet may constitute a backlight unit.

The light-emitting module includes light-emitting device packages 835 mounted on a board 830. A PCB may be used as the board 830. Each of the light-emitting device packages 835 may be the light-emitting device package according to the embodiment shown in FIG. 12.

Components of the display apparatus 800 may be mounted in the bottom cover 810. The reflecting plate 820 may be provided as a separate component, as shown in this figure. Alternatively, the rear of the light guide plate 840 or the front of the bottom cover 810 may be coated with a material exhibiting high reflectance to form the reflecting plate 820.

The reflecting plate 820 may be formed of a material that exhibits high reflectance and can be formed in a very thin shape. For example, the reflecting plate 820 may be made of polyethylene terephthalate (PET).

The light guide plate 840 may be made of polymethylmethacrylate (PMMA), polycarbonate (PC) or polyethylene (PE).

The first prism sheet 850 may be formed by attaching an elastic polymer material exhibiting light transmission to one surface of a support film. The polymer may have a prism layer in which a plurality of three-dimensional patterns is repeatedly formed. As shown, the patterns may be formed in a striped pattern including alternately arranged ridges and valleys.

The extension direction of the ridges and valleys formed at one surface of the support film of the second prism sheet 860 may be perpendicular to the extension direction of the ridges and valleys formed at one surface of the support film of the first prism sheet 850. As a result, light transmitted from the light source module and the reflecting sheet is uniformly distributed to the front of the display panel 870.

Although not shown, a diffusion sheet may be disposed between the light guide plate 840 and the first prism sheet 850. The diffusion sheet may be made of a polyester-based or polycarbonate-based material. The diffusion sheet may refract and scatter light incident from the backlight unit to maximize a light projection angle. The diffusion sheet may include a support layer containing a light-dispersing agent, and a first layer and a second layer, not containing a light-dispersing agent, formed at a light emission surface (toward the first prism sheet) and a light incidence surface (toward the reflecting sheet).

In this embodiment, the diffusion sheet, the first prism sheet 850, and the second prism sheet 860 constitute an optical sheet. Alternatively, the optical sheet may be constituted by other combinations, such as a micro lens array, a combination of the diffusion sheet and the micro lens array, or a combination of one of the prism sheets and the micro lens array.

A liquid crystal display panel may be used as the display panel 870. Alternatively, other kinds of display apparatuses requiring a light source may be provided in addition to the liquid crystal display panel 860.

Features, structures, and effects described in the above embodiments are included in at least one embodiment, but are not limited to only one embodiment. Furthermore, features, structures, and effects illustrated in each embodiment may be combined or modified in other embodiments by those skilled in the art to which the embodiments pertain. Therefore, it is to be understood that such combinations and modifications fall within the scope of the present disclosure.

INDUSTRIAL APPLICABILITY

Embodiments may be used in a light-emitting device, a light-emitting device package, a lighting apparatus, and a display apparatus having reduced operating voltage and improved light extraction efficiency.

The invention claimed is:

1. A light-emitting device comprising:
 a substrate;
 a light-emitting structure comprising a first conductive semiconductor layer disposed on the substrate, a second conductive semiconductor layer disposed on the first conductive semiconductor layer, and an active layer disposed between the first conductive semiconductor layer and the second conductive semiconductor layer; and
 a light-transmissive conductive layer disposed on the second conductive semiconductor layer, wherein
 the light-transmissive conductive layer comprises:
  a first conductive oxide layer disposed on the second conductive semiconductor layer, the first conductive oxide layer comprising at least one first metal element and oxygen; and
  a second conductive oxide layer disposed on the first conductive oxide layer such that the first conductive oxide layer is between the second conductive semiconductor layer and the second conductive oxide layer, wherein the second conductive oxide layer has a smaller thickness than the first conductive oxide layer,
  wherein the second conductive oxide layer comprises a plurality of grains disposed on a surface of the first conductive oxide layer, and
 wherein each of the grains of the second conductive oxide layer is made of a compound of a metal element identical to the first metal element, a second metal element, and oxygen,
 wherein the at least one first metal element is indium or tin, and the second metal element of the second conductive oxide layer is aluminum, wherein the second metal element of the plurality of grains of the second conductive oxide layer is coupled to oxygen dangling bonds of the second conductive oxide layer.

2. The light-emitting device according to claim 1, wherein the second metal element has lower Gibbs free energy than the first metal element.

3. The light-emitting device according to claim 1, wherein
 a ratio of a thickness of the second conductive oxide layer to a thickness of the first conductive oxide layer ranges from 1:1.5 to 1:5.25.

4. The light-emitting device according to claim 1, wherein each of the grains of the second conductive oxide layer has a height ranging from 8 nm to 12 nm.

5. The light-emitting device according to claim 1, wherein the second conductive oxide layer comprises:
 a first region in which the grains are formed; and
 a second region located between the respective grains, the second region exposing a portion of the surface of the first conductive oxide layer.

6. The light-emitting device according to claim 1, wherein the grains comprise at least one of:
 a compound of aluminum, indium, tin, and oxygen.

7. The light-emitting device according to claim 6, wherein each of the grains of the second conductive oxide layer has a height ranging from 8 nm to 12 nm.

8. The light-emitting device according to claim 7, wherein a thickness of the first conductive oxide layer ranges from 18 nm to 42 nm.

9. The light-emitting device according to claim 1, wherein the first conductive semiconductor layer is n-type semiconductor layer, and the second conductive semiconductor layer is p-type semiconductor layer.

10. The light-emitting device according to claim 9, further comprising a current-blocking layer disposed between the second conductive semiconductor layer and the light-transmissive conductive layer, and
 wherein at least a portion of the current-blocking layer overlaps the second electrode in a vertical direction.

11. The light-emitting device according to claim 9, further comprising:

a first electrode disposed on the first conductive semiconductor layer; and a second electrode disposed on the light-transmissive conductive layer.

12. The light-emitting device according to claim 11, further comprising a first light-transmissive conductive layer disposed between the first conductive semiconductor layer and the first electrode.

13. The light-emitting device according to claim 12, wherein the first light-transmissive conductive layer comprises:

a third conductive oxide layer comprising at least one first metal element and oxygen; and a fourth conductive oxide layer disposed on the third conductive oxide layer.

14. The light-emitting device according to claim 13, wherein the fourth conductive oxide layer comprises a plurality of grains disposed on a surface of the third conductive oxide layer, and wherein each of the grains is made of a compound of a metal element identical to the first metal element, a second metal element, and oxygen.

15. A light-emitting device comprising:

a substrate;

a light-emitting structure comprising a n-type semiconductor layer disposed on the substrate, a p-type semiconductor layer disposed on the n-type semiconductor layer, and an active layer disposed between the n-type semiconductor layer and the p-type semiconductor layer;

a light-transmissive conductive layer disposed on the p-type semiconductor layer, an electrode disposed on the light-transmissive conductive layer; and wherein the light-transmissive conductive layer comprises:

a first conductive oxide layer comprising at least one first metal element and oxygen; and a second conductive oxide layer disposed on the first conductive oxide layer such that the first conductive oxide layer is between the p-type semiconductor layer and the second conductive oxide layer, wherein the second conductive oxide layer has a smaller thickness than the first conductive oxide layer, wherein the second conductive oxide layer comprises a plurality of grains disposed on a surface of the first conductive oxide layer, and wherein each of the grains of the second conductive oxide layer is made of a compound of a metal element identical to the first metal element, a second metal element, and oxygen, wherein the at least one first metal element is indium or tin, and the second metal element of the second conductive oxide layer is aluminum, wherein the second metal element of the plurality of grains of the second conductive oxide layer is coupled to oxygen dangling bonds of the second conductive oxide layer.

16. A light-emitting device comprising:

a substrate;

a light-emitting structure comprising a n-type semiconductor layer disposed on the substrate, a p-type semiconductor layer disposed on the n-type semiconductor layer, and an active layer disposed between the n-type semiconductor layer and the p-type semiconductor layer;

a first light-transmissive conductive layer disposed on the p-type semiconductor layer, a first electrode disposed on the n-type semiconductor layer;

a second electrode disposed on the first light-transmissive conductive layer; and a second light-transmissive conductive layer disposed between the n-type semiconductor layer and the first electrode, wherein each of the first and second light-transmissive conductive layers comprises:

a first conductive oxide layer comprising at least one first metal element and oxygen; and a second conductive oxide layer disposed on the first conductive oxide layer such that the first conductive oxide layer is between the p-type semiconductor layer and the second conductive oxide layer, wherein the second conductive oxide layer has a smaller thickness than the first conductive oxide layer, wherein the second conductive oxide layer comprises a plurality of grains disposed on a surface of the first conductive oxide layer, and wherein each of the grains of the second conductive oxide layer is made of a compound of a metal element identical to the first metal element, a second metal element, and oxygen, wherein the at least one first metal element is indium or tin, and the second metal element of the second conductive oxide layer is aluminum, wherein the second metal element of the plurality of grains of the second conductive oxide layer is coupled to oxygen dangling bonds of the second conductive oxide layer.

* * * * *